(12) United States Patent
Park et al.

(10) Patent No.: US 12,538,444 B2
(45) Date of Patent: Jan. 27, 2026

(54) DISPLAY DEVICE AND MANUFACTURING METHOD THEREOF

(71) Applicant: Samsung Display Co., LTD., Yongin-si (KR)

(72) Inventors: Cheul Jin Park, Yongin-si (KR); Hyun Chul Bae, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 185 days.

(21) Appl. No.: 18/019,789

(22) PCT Filed: Aug. 4, 2021

(86) PCT No.: PCT/KR2021/010223
§ 371 (c)(1),
(2) Date: Feb. 3, 2023

(87) PCT Pub. No.: WO2022/030999
PCT Pub. Date: Feb. 10, 2022

(65) Prior Publication Data
US 2024/0040727 A1    Feb. 1, 2024

(30) Foreign Application Priority Data
Aug. 4, 2020  (KR) .......................... 10-2020-0097401

(51) Int. Cl.
*H05K 5/00*     (2025.01)
*B32B 1/00*     (2006.01)
(Continued)

(52) U.S. Cl.
CPC ................. *H05K 5/03* (2013.01); *B32B 1/00* (2013.01); *B32B 3/04* (2013.01); *B32B 15/08* (2013.01);
(Continued)

(58) Field of Classification Search
CPC .... H05K 5/03; B32B 1/00; B32B 3/04; B32B 15/08; B32B 27/08; B32B 27/34;
(Continued)

(56) References Cited

U.S. PATENT DOCUMENTS 9,379,355 B1 *  6/2016  Lee ........................... B32B 7/12
9,430,180 B2 *  8/2016  Hirakata ................... G09G 5/14
(Continued)

FOREIGN PATENT DOCUMENTS

| | | |
|---|---|---|
| CN | 107644589 A | 1/2018 |
| CN | 110580111 A | 12/2019 |

(Continued)

OTHER PUBLICATIONS

Extended European Search Report—European Patent Application No. 21854068.0 dated Jul. 26, 2024, citing references listed within.
(Continued)

*Primary Examiner* — Rockshana D Chowdhury
(74) *Attorney, Agent, or Firm* — CANTOR COLBURN LLP

(57) ABSTRACT

A display device according to an embodiment includes: a window including a flat area and a curved area; a display panel including a display area, a connection region, and a bending region between the display area and the connection region; and a fixing member including a flat portion and a curved portion and fixed to the connection region. The display area is attached to the window, and the connection region is disposed on a rear side of the display area together with the fixing member.

16 Claims, 14 Drawing Sheets

US 12,538,444 B2

Page 2

(51) Int. Cl.
  *B32B 3/04* (2006.01)
  *B32B 15/08* (2006.01)
  *B32B 27/08* (2006.01)
  *B32B 27/34* (2006.01)
  *B32B 27/36* (2006.01)
  *H05K 5/03* (2006.01)

(52) U.S. Cl.
  CPC .............. *B32B 27/08* (2013.01); *B32B 27/34* (2013.01); *B32B 27/36* (2013.01); *B32B 2307/202* (2013.01); *B32B 2307/206* (2013.01); *B32B 2307/7244* (2013.01); *B32B 2307/7246* (2013.01); *B32B 2457/20* (2013.01)

(58) Field of Classification Search
  CPC .............. B32B 27/36; B32B 2307/202; B32B 2307/206; B32B 2307/7244; B32B 2307/7246; B32B 2457/20; B32B 15/20; B32B 2307/412; B32B 2307/42; B32B 7/12; B32B 27/281; H10K 59/12; H10K 59/871; H10K 59/872; G06F 1/1626; G06F 1/1637; G06F 1/1652; G06F 3/0412; G06F 2203/04102; H01L 25/167; H01L 27/156; G09F 9/30
  See application file for complete search history.

(56) References Cited

U.S. PATENT DOCUMENTS

| | | | |
|---|---|---|---|
| 9,793,502 B2 | 10/2017 | Saeki et al. | |
| 10,121,978 B2 | 11/2018 | Saeki et al. | |
| 10,165,715 B2 | 12/2018 | Choi et al. | |
| 10,283,723 B2 | 5/2019 | Saeki et al. | |
| 10,288,974 B2* | 5/2019 | Hou | G06F 1/1652 |
| 10,496,136 B2 | 12/2019 | Kim et al. | |
| 10,510,816 B2 | 12/2019 | Kim et al. | |
| 10,707,430 B2 | 7/2020 | Saeki et al. | |
| 10,712,780 B2 | 7/2020 | Kim et al. | |
| 10,903,289 B2 | 1/2021 | Kim et al. | |
| 11,296,287 B2 | 4/2022 | Saeki et al. | |
| 11,360,518 B2* | 6/2022 | Shin | G09F 9/301 |
| 11,668,983 B2* | 6/2023 | Lim | G02F 1/1345 |
| | | | 257/40 |
| 12,083,775 B2* | 9/2024 | Liu | B32B 27/32 |
| 2015/0316810 A1* | 11/2015 | Shibahara | G02F 1/133382 |
| | | | 349/150 |
| 2016/0334560 A1* | 11/2016 | You | G02B 6/0091 |
| 2017/0263492 A1* | 9/2017 | Son | G02F 1/1303 |
| 2017/0293194 A1* | 10/2017 | Hou | G02F 1/167 |
| 2018/0022013 A1 | 1/2018 | Choi et al. | |
| 2018/0059728 A1 | 3/2018 | Kim et al. | |
| 2018/0337220 A1 | 11/2018 | Kim et al. | |
| 2019/0343010 A1 | 11/2019 | Ji et al. | |
| 2019/0380197 A1 | 12/2019 | Lee et al. | |
| 2020/0009803 A1 | 1/2020 | Kang et al. | |
| 2020/0022261 A1* | 1/2020 | Choi | H05K 7/20963 |
| 2020/0057472 A1* | 2/2020 | Kang | G06F 1/1601 |
| 2020/0174526 A1* | 6/2020 | Jeong | G09F 9/301 |
| 2022/0344615 A1 | 10/2022 | Li et al. | |

FOREIGN PATENT DOCUMENTS

| | | |
|---|---|---|
| CN | 210836910 U | 6/2020 |
| JP | 2016188975 | 11/2016 |
| KR | 1020140108827 | 9/2014 |
| KR | 1020170133200 | 12/2017 |
| KR | 1020180023133 | 3/2018 |
| KR | 1020180068382 | 6/2018 |
| KR | 1020180074891 | 7/2018 |
| KR | 1020180127606 | 11/2018 |
| KR | 101962365 | 7/2019 |
| KR | 1020190094867 | 8/2019 |
| KR | 102090124358 | 11/2019 |

OTHER PUBLICATIONS

International Search Report—PCT/KR2021/010223 dated Nov. 22, 2021, citing references listed within.

* cited by examiner

DISPLAY DEVICE AND MANUFACTURING METHOD THEREOF

TECHNICAL FIELD

This disclosure relates to a display device, and more particularly, relates a display device including a curved display area and a method of manufacturing the same.

BACKGROUND ART

A display device such as an emissive display device is applied to an electronic device such as a smart phone, a mobile phone, a tablet PC, and a multimedia terminal. Since a display device, particularly, a screen of the display device, is exposed to the outside of the electronic device, the display device is a key element in the design of the electronic device.

Typically, a screen of the display device is flat. As a flexible display device has been developed, where the screen is not limited to a flat surface, but may be formed with a curved surface. In particular, when an edge of the display device is formed as a curved surface, a screen-to-body ratio of the display device can be increased. The screen-to-body ratio reflects the technology level of the display device and can play an important role in selecting the product by the consumer. Therefore, the development of a bezel-less display device having a screen-to-body ratio close to 1 or 1, that is, a display device in which only the screen is visible when viewed from the front, is desirable.

DISCLOSURE

Technical Problem

Embodiments are to provide a display device with an increased screen-to-body ratio and a curved display area and a method for manufacturing the same.

Technical Solution

A display device according to an embodiment includes: a window including a flat area and a curved area; a display panel including a display area, a connection region, and a bending region between the display area and the connection region; and a fixing member including a flat portion and a curved portion, and is fixed to the connection region. The display area is attached to the window, and the connection region is disposed on a rear side of the display area together with the fixing member.

The display device may further include a tape, which attaches the fixing member to the rear side of the display area.

A curvature center of the curved area of the window and a curvature center of the curved portion of the fixing member may be substantially equivalent.

The display area may include a flat area and a curved area, and a curvature center of the curved area of the display area and a curvature center of the curved portion of the fixing member may be substantially equivalent.

The connection region may be disposed between the display area and the fixing member.

The display device may further include an integrated circuit ("IC") chip mounted on the connection region.

The fixing member may be disposed between the bending region and the IC chip.

The connection region may include a pad portion where pads are arranged around an edge of the connection region.

A width of the fixing member may be equal to or larger than a width of the connection region.

The bending region may be bent, the connection region may have a flat shape corresponding to the flat portion and a curved shape corresponding to the curved portion, and the connection region may be in contact with a rear side of the display area.

The display area may include a flat area and a curved area, and the curved area of the window may have a larger curvature radius than the curved area of the display area, and the curved area of the display area may have a larger curvature radius than the curved portion.

A display device according to an embodiment includes: a window; a display panel including a display area attached to a rear side of the window and a connection region fixed to a rear side of the display area; a fixing member attached to the connection region; and a tape attaching the fixing member to a rear side of the display panel.

The window may include a curved area, the fixing member may include a curved portion corresponding to the curved area of the window, and a curvature center of the curved area of the window and a curvature center of the curved portion may be substantially equivalent.

The connection region may be disposed between the display area and the fixing member, and the connection region may have a curved shape corresponding to the curved portion of the fixing member.

The display area may include a curved area attached to the curved area of the window, and the curved area of the window may have a larger curvature radius than the curved area of the display area, while the curved area of the display area has a larger curvature radius than the curved portion.

The display device may further include an integrated circuit (IC) chip mounted on the connection region, wherein the connection region may include a pad portion where pads are arranged around an edge of the connection region.

A manufacturing method of a display device according to an embodiment includes: attaching a display area of a display panel to a rear side of a window that including a curved area; attaching a fixing member including a flat portion and a curved portion to a connection region of the display panel; bending a bending region of the display panel, and positioning the connection region, to which the fixing member is attached, adjacent to a rear side of the display area; and fixing the fixing member to a rear side of the display panel while pressing the fixing member with a pressing pad.

The fixing of the fixing member may include attaching a tape over an edge of the fixing member and the rear side of the display panel.

After fixing the fixing member, the connection region may be disposed between the display area and the fixing member, and a curvature center of the curved area of the window and a curvature center of the curved portion may be substantially equivalent.

An IC chip may be mounted on the connection region, and the connection region may include a pad portion where pads are arranged around an edge of the connection region.

Advantageous Effects

According to the embodiments, a display device with an improved screen-to-body ratio and a curved display area can be provided. In particular, it is possible to provide a display device in which a display panel is attached and a connection region of the display panel is fixed according to the shape of the window with the curved area, and utilization of the internal space of the electronic device can be effectively increased. In addition, according to the embodiments, there are advantageous effects that can be recognized throughout the specification.

MODE FOR INVENTION

Figure 1:
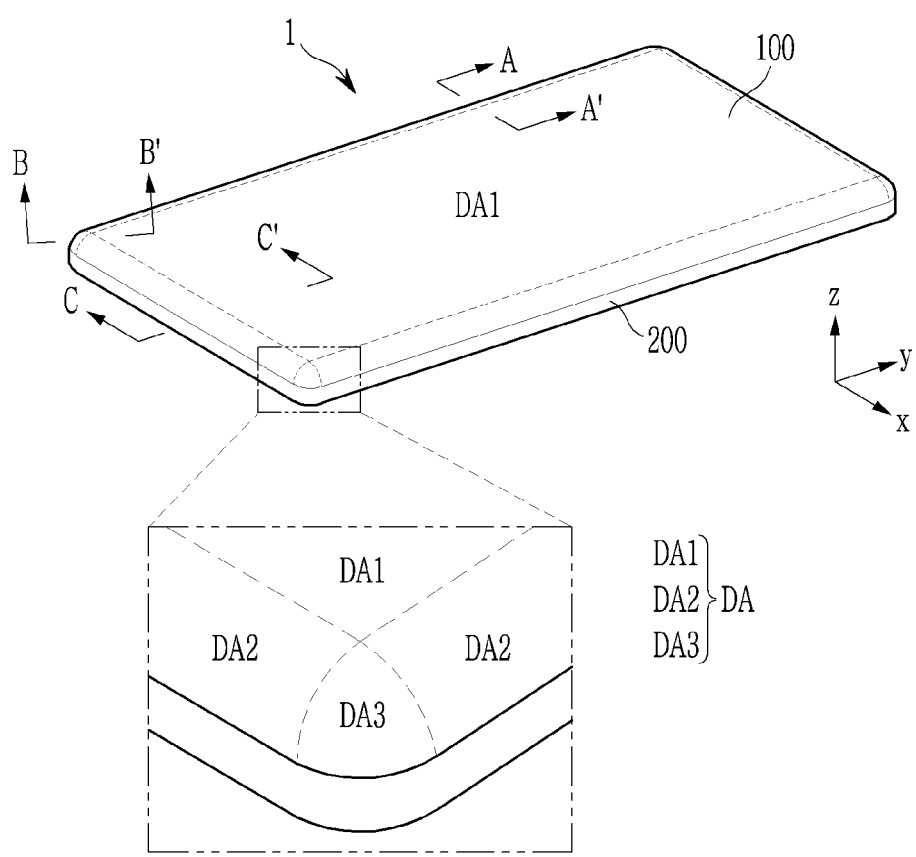
FIG. 1 is a schematic perspective view of an electronic device to which a display device according to an embodiment is applied.

With reference to the accompanying drawing, this disclosure will be described in detail and therefore a person of an ordinary skill can easily implement it in this technical field.

The size and thickness of each component shown in the drawing are arbitrarily indicated for better understanding and ease of description.

When a part of a layer, film, region, plate, and the like is "on" or "above" another part, it includes not only the case where it is "directly on" another component, but also the case where there is another component in between. On the contrary, when a component is "right above" another, it means that there are no other components in between.

"About" "substantially equivalent" or "approximately" or as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

In addition, unless explicitly described to the contrary, the word "comprise" and variations such as "comprises" or "comprising" will be understood to imply the inclusion of stated elements but not the exclusion of any other elements.

Throughout the specification, "connected" or "in contact with" does not mean only when two or more constituent elements are directly connected, but may also include a case that two or more constituent elements are indirectly connected through other constituent elements, a case that they are physically connected, a case of electrically connected, and a case in which each part that is substantially integral with each other while being referred to by a different name depending on a position or function.

In the drawings, the symbols x, y and z are used to indicate direction. "x" is a first direction, "y" is a second direction that is perpendicular to the first direction, and "z" is a third direction that is perpendicular to the first direction and the second direction.

FIG. 1 is a schematic perspective view of an electronic device to which a display device according to an embodiment is applied.

Referring to FIG. 1, a display device 100 according to an embodiment may be applied to an electronic device 1 such as a smart phone, a mobile phone, a tablet PC, a multimedia player, a game machine, and the like. The electronic device 1 may include a display device 100 and a housing 200. The display device 100 provides a screen on which an image is displayed in the electronic device 1. The housing 200 may be called a set frame, and may fix the display device 100. In an inner space defined by the display device 100 and the housing 200, several components constituting the electronic device 1 are positioned. For example, a processor, a memory, a battery, a driving apparatus, a camera, a speaker, a microphone, a receiver, a communication module, a sensor, and the like may be positioned inside the electronic device 1.

A front of the electronic device 1 may correspond to the screen, and at least a portion of sides may also correspond to the screen. The screen corresponds to a display area DA of the display device 100. The display area DA may include a first display area DA1 positioned in front, second display areas DA2 positioned on at least two sides of the first display area DA1, and a third display area DA3 positioned at the corner of the first display area DA1. The first display area DA1 is positioned in a center of the display device 100 and may occupy most of the screen. The first display area DA1 may be a flat area 10a. The second display area DA2 and the third display area DA3 are positioned around the first display area DA1. The second display area DA2 and the third display area DA3 may be curved areas 10b.

The first display area DA1 may occupy the widest area in the entire display area DA. The first display area DA1 is substantially flat, and a flat screen may be formed. In the plan view, the first display area DA1 may have a rectangular shape having four sides as a whole. The corners of the first display area DA1 may be sharp as shown, but may also be rounded. The four sides of the first display area DA1 may be parallel to the first direction (x) or the second direction (y), respectively. As used herein, the "plan view" is a view in z direction (i.e., thickness direction of the display device.)

The second display area DA2 may include four areas connected to the four sides of the first display area DA1, respectively, and may include only some of them. Each second display area DA2 has a curved surface, and may form a curved screen. The curvature of the second display area DA2 may be constant or different depending on the position on the curved surface. The second display area DA2 may have a shape similar to a portion (e.g., ¼) of a side surface of a curved column such as a circular column or an elliptical column.

The third display areas DA3 are positioned at four corners or some corners of the display device 100, respectively. The third display area DA3 may be positioned between adjacent second display areas DA2. Each third display area DA3 has a curved surface and may form a curved screen. The curvature of the third display area DA3 may be constant or different depending on the position on the curved surface. The shape of the curved surface of the third display area DA3 may be different from the shape of the curved surface of the second display area DA2. The third display area DA3 may have a shape similar to a part (e.g., ⅛) of a curved body such as a sphere or an ellipse.

When the electronic device 1 is viewed from the front, the whole of the first display area DA1 and at least a part of the second display area DA2 and the third display area DA3 are combined, and thus it may be recognized as a screen having a rectangular shape with rounded corners as a whole. The housing 200 is invisible or almost invisible, and a substantially bezel-less electronic device 1 with a screen-to-body ratio of almost 1 may be implemented.

Figure 2:
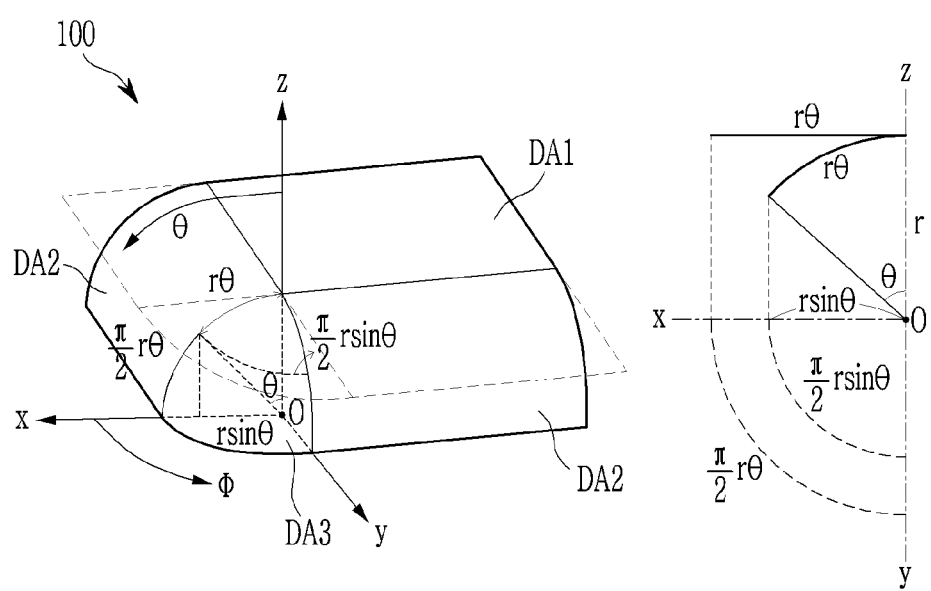
FIG. 2 shows the shape of the round corner of the display device according to the embodiment as a geometric display means.

FIG. 2 shows the shape of the round corner of the display device according to the embodiment as a geometric display means.

Referring to FIG. 2, the position on the screen (it may also be called on a curved surface) of the third display area DA3 may be expressed in a polar coordinate system with a curvature radius r with a center of curvature O, an angle θ formed with a third direction z (referred to as polar angle, unit is radians), and an angle φ (referred to as azimuthal angle with respect to a first direction x, unit is radians) formed by the projection of the position to an x-y plane (a plane formed by the first direction x and the second direction y). The curvature radius r may be constant or may change according to the position on the screen or the curved surface of the third display area DA3. The curvature radius of constituent elements with a thickness in this specification is based on the interior circumference.

Figure 3:
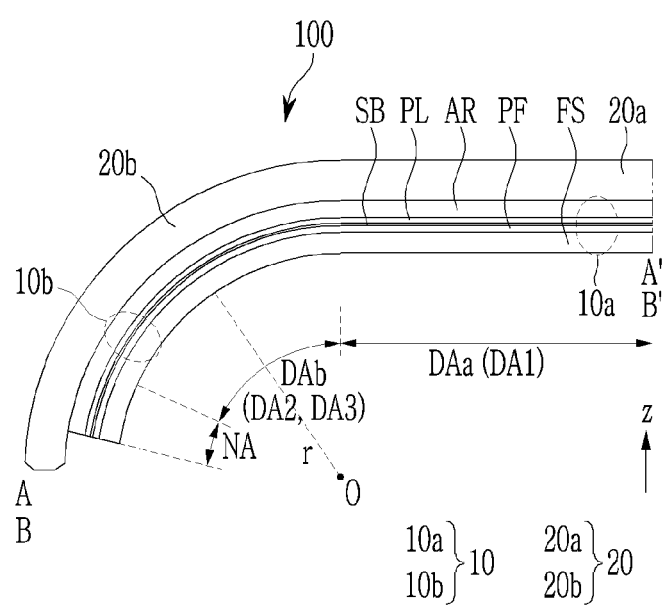
FIG. 3 is a schematic cross-sectional view of the display device 100 of FIG. 1 taken along line A-A' or B-B'.
Figure 4:
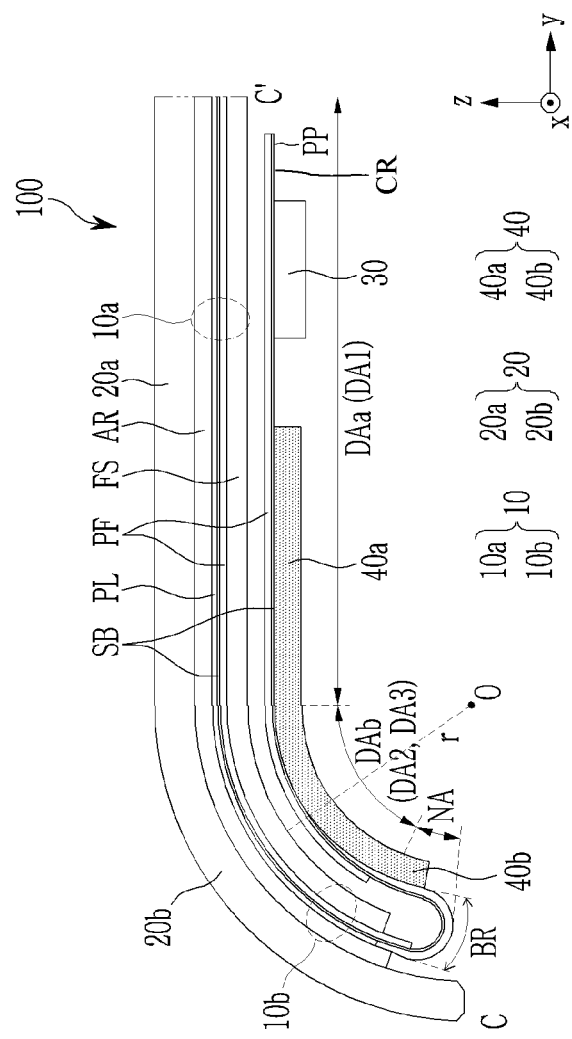
FIG. 4 is a schematic cross-sectional view of the display device 100 of FIG. 1, taken along line C-C'.
Figure 5:
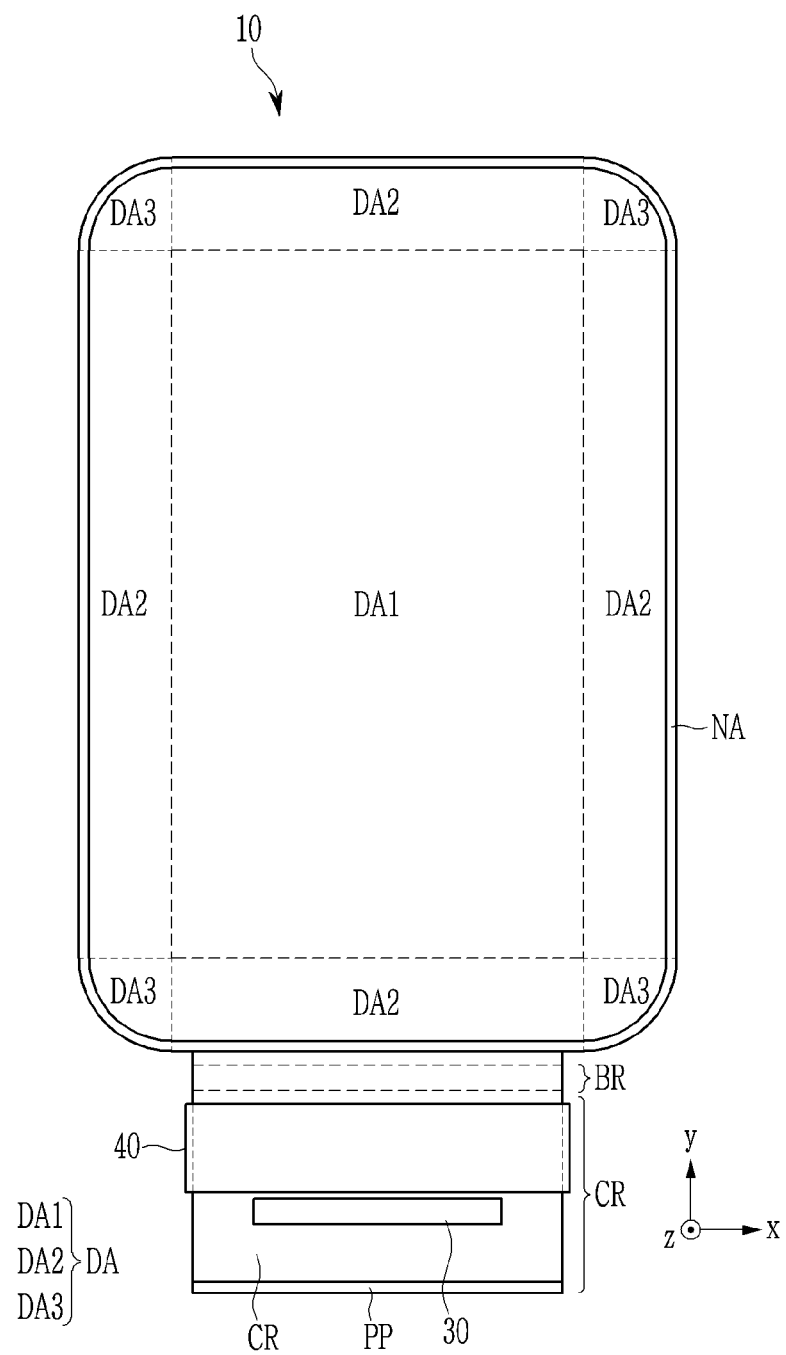
FIG. 5 is a schematic top plan view of a display panel 10 according to the embodiment.

FIG. 3 is a schematic cross-sectional view of the display device 100 of FIG. 1 taken along line A-A' or B-B', FIG. 4 is a schematic cross-sectional view of the display device 100 of FIG. 1, taken along line C-C', and FIG. 5 is a schematic top plan view of a display panel 10 according to the embodiment.

Referring to FIG. 3, FIG. 4, and FIG. 5, the display device 100 includes a display panel 10 and a window 20. The display panel 10 is attached to the back (i.e., rear side) of the window 20. FIG. 5 illustrates the display panel 10 before being attached to the window 20.

In the display device 100, an image is displayed by the display panel 10, and the window 20 transmits the image displayed on the display panel 10 while covering the display panel 10. Accordingly, the first display area DA1, the second display area DA2, and the third display area DA3 of the display device 100 may be described in the same concept as the first display area DA1, the second display area DA2, and the third display area DA3 of the display panel 10, respectively.

The display panel 10 includes a display area DA displaying an image, and a non-display area NA at the periphery of the display area DA. At least a part of the display panel 10 may be flexible. The display panel 10 includes a pixel layer PL in which pixels are arranged on a substrate SB, and displays an image by a combination of the pixels. Pixels including, for example, red pixels, green pixels, and blue pixels are arranged in the first display area DA1, the second display area DA2, and the third display area DA3.

In the display panel 10, wires that transmit signals to drive pixels are disposed on the substrate SB. The wires may include a data line, a gate line, and a driving voltage line that are disposed to the display area DA, and may include connection wires that are disposed to the non-display area NA. The display panel 10 may be a light emitting display panel including light emitting elements. The display panel 10 may include a touch sensor layer that can sense a user's touch. In the drawing, the display panel 10 is illustrated to include several layers. In addition to the pixel layer PL, the display panel 10 may include layers such as an anti-reflection layer AR, a protective film PF, and a functional sheet FS, which will be described later.

The display panel 10 includes a pad portion PP in which pads for receiving signals (including power) from the outside are arranged. Signals (e.g., touch detection signals) generated by the display panel 10 may also be externally output through the pad portion PP. The display panel 10 includes a connection region CR extending from one second display area DA2, and the pad portion PP may be positioned at an end of the connection region CR. Connection wires for transmitting signals to pixels are disposed in the connection region CR. The connection region CR may have a planar shape of an approximate quadrangle.

The display panel 10 includes a bending region between the second display area DA and the connection region CR. The bending region may be positioned long in the first direction (x). The bending region may be bent such that the connection region CR is positioned on the back surface of the display panel 10. The bending region may be bent to have an interior diameter of about 1 mm or less, about 0.5 mm or less, for example about 0.3 mm, with reference to a bending axis parallel to the first direction (x). The bending region and the connection region CR may be included in the non-display area NA.

The window 20 is a kind of cover that protects the display panel 10 from external impact. The window 20 may serve as a support to maintain the curved surface of the display panel 10. The window 20 may be made of a transparent and hard material such as glass or plastic such that the user can see the image displayed on the screen of the display panel 10.

The display device 100 includes a driving apparatus that generates and/or processes various signals for driving the display panel 10. The driving apparatus includes a data driver that applies a data voltage to a data line, a gate driver that applies a gate signal to a gate line, and a signal controller that controls the data driver and the gate driver. The gate driver may be integrated as a driving circuit outside the second display area DA2 in the display panel 10. The data driver and signal controller may be provided as an IC chip 30. The IC chip 30 may be mounted on the connection region CR of the display panel 10, and may be positioned between the bending region and the pad portion PP. The IC chip 30 may be mounted on a flexible printed circuit film (not shown) connected to the pad portion PP of the display panel 10.

The display device 100 is generally flat in the first display area DA1, and is curved in a predetermined curvature in the second display area DA2 and the third display area DA3 to form a curved surface. The flat first display area DA1 is a flat display area DAa. The curved second and third display areas DA2 and DA3 are a curved display areas DAb. A curvature radius r of the curved display area DAb may be constant or variable depending on the position. Corresponding to the flat display area DAa of the display device 100, the display panel 10 includes a flat area 10a, and the window 20 includes a flat area 20a. Corresponding to curved display area DAb, the display panel 10 includes a curved area 10b and the window 20 includes a curved area 20b. In the cross-sectional view, a curvature center of the curved area 20b of the window 20 may coincide with or almost coincide with (i.e., substantially equivalent) a curvature center O of the curved area 10b of the display panel 10. A curvature radius of the curved area 20b of the window 20 may be larger than a curvature radius r of the curved area 10b of the display panel 10.

The display panel 10 is attached to the window 20 by an adhesive such as an optically clear adhesive ("OCA") or an optically clear resin ("OCR"), and the adhesive layer (not shown) may be positioned between the display panel 10 and the window 20. The flat area 10a of the display panel 10 may be attached to the flat area 20a of the window 20, and the curved area 10b of the display panel 10 may be attached to the curved area 20b of the window 20. The entire flat area 10a of the display panel 10 may be the first display area DA1. Most of the curved area 10b of the display panel 10 is the second and third display areas DA2 and DA3, but it may include the non-display area NA outside the second and third display areas DA2 and DA3.

The bending region BR and the connection region CR of the display panel 10 are positioned on the rear side of the window 20, but are not attached to the window 20, and the rear side of the flat area 10a and curved area 10b of the display panel 10 (hereinafter, unless otherwise specified, called the rear side of the display panel 10). As the connection region CR has a shape that matches the curved area 10b of the display panel 10 and is positioned close to or to closely contact the back surface of the display panel 10, the utilization of the internal space of the electronic device 1 can be increased, and the margin and design freedom for device shape or alignment can be increased. In the present specification, close contact means that the two constituent elements are not only in contact, but also positioned closely at a predetermined interval (e.g., about 500 nanometers (nm) or less).

To attach the connection region CR to the rear side of the display panel 10 (especially, the rear side of the first display area DA1), a double-sided adhesive tape may be attached to the rear side of the display panel 10, the bending region BR may be bent, and then the connection region CR is pressed to be attached to the rear side of the first display area DA1. When attached in this way, the connection region CR can be closely adhered to the rear side of the flat area 10a of the display panel 10 in conformity with the curved area 10b of the display panel 10 and the curved area 20b of the window 20. However, the display panel 10 may be damaged when the connection region CR is pressed using a multi-joint press or roller for example such that it is attached to the curved area 10b. In addition, a repulsive force may be generated due to the curved portion of the connection region CR (a portion corresponding to the curved area 10b), thereby deteriorating adhesion, and the connection region CR may be detached (particularly, in a high temperature and high humidity environment). In order to solve such a problem, the display device 100 includes a fixing member 40 for attaching the connection region CR to the rear side of the display panel 10 while maintaining the curved shape of the connection region CR.

The fixing member 40 may be in the form of a plate in which a part is curved with a predetermined curvature radius. The fixing member 40 includes a flat portion 40a and a curved portion 40b. The flat portion 40a may correspond to the flat areas 10a and 20a of the display panel 10 and the window 20. The curved portion 40b may correspond to the curved areas 10b and 20b of the display panel 10 and the window 20, and may have a shape corresponding to the curved areas 10b and 20b. The fixing member 40 is attached to the connection region CR, and the connection region CR is closely attached to the rear side of the display area DA together with the fixing member 40. A width of the fixing member 40 may be equal to or wider than the width of the connection region CR in the first direction (x). Opposite ends of fixing member 40 may be fixed to the rear side of the display panel 10 by tape (not shown). Therefore, the rear side of display panel 10 can be fixed closely to the rear side of the display panel 10 without using the double-sided adhesive tape at the connection region CR between the rear side of display panel 10 and the connection region CR, that is, without attaching the connection region CR to the rear side of display panel 10. Since the connection region CR is attached to the fixing member 40, a curved shape corresponding to the curved portion 40b of the fixing member 40 can be maintained. In addition, since the fixing member 40 is fixed to the rear side of the display panel 10 and the connection region CR is pressed by the fixing member 40, the connection region CR can be closely fixed to the rear side of the display panel 10. A method for fixing the connection region CR using the fixing member 40 will be described later.

The fixing member 40 may be formed of a material having a relatively high modulus of a GPa unit (or called an elasticity coefficient (modulus of elasticity)) of the GPa unit to maintain its shape, for example a metal or a metal alloy, or a plastic. The fixing member 40 may be formed by press-processing a metal plate, or may be formed by extrusion-molding a plastic.

In order to make the connection region CR as close as possible to the rear side of the display panel 10, the curvature center of the curved portion 40b may coincide with or almost coincide with (i.e., substantially equivalent) the curvature center O of the curved area 10b of the display panel 10, and the curved area 20b of the window 20 may coincide or nearly coincide with the curvature center. The curvature radius of the curved portion 40b may be smaller than the curvature radius r of the curved area 10b.

In FIG. 5, the fixing member 40 positioned in the connection region CR of the display panel 10 is illustrated. The fixing member 40 shown in FIG. 5 is to indicate the position where the fixing member 40 is provided on the display panel 10 (i.e., between the bending region and the IC chip 30) and the approximate size of the fixing member 40. The fixing member 40 may be attached to the connection region CR after the display panel 10 is attached to the window 20. The fixing member 40 may be attached to the connection region CR before the display panel 10 is attached to the window 20.

A method of manufacturing the display device 100 according to the embodiment, particularly a method of attaching the display panel 10 to the window 20 and fixing the connection region CR, will be described with reference to FIG. 6 to FIG. 13. In order to explain the correspondence with the display device 100, FIG. 1 to FIG. 5 will also be referred to.

FIG. 6, FIG. 7, FIG. 8, FIG. 9, FIG. 10, FIG. 11, FIG. 12, and FIG. 13 show a manufacturing method of the display device according to an embodiment.

Figure 6:
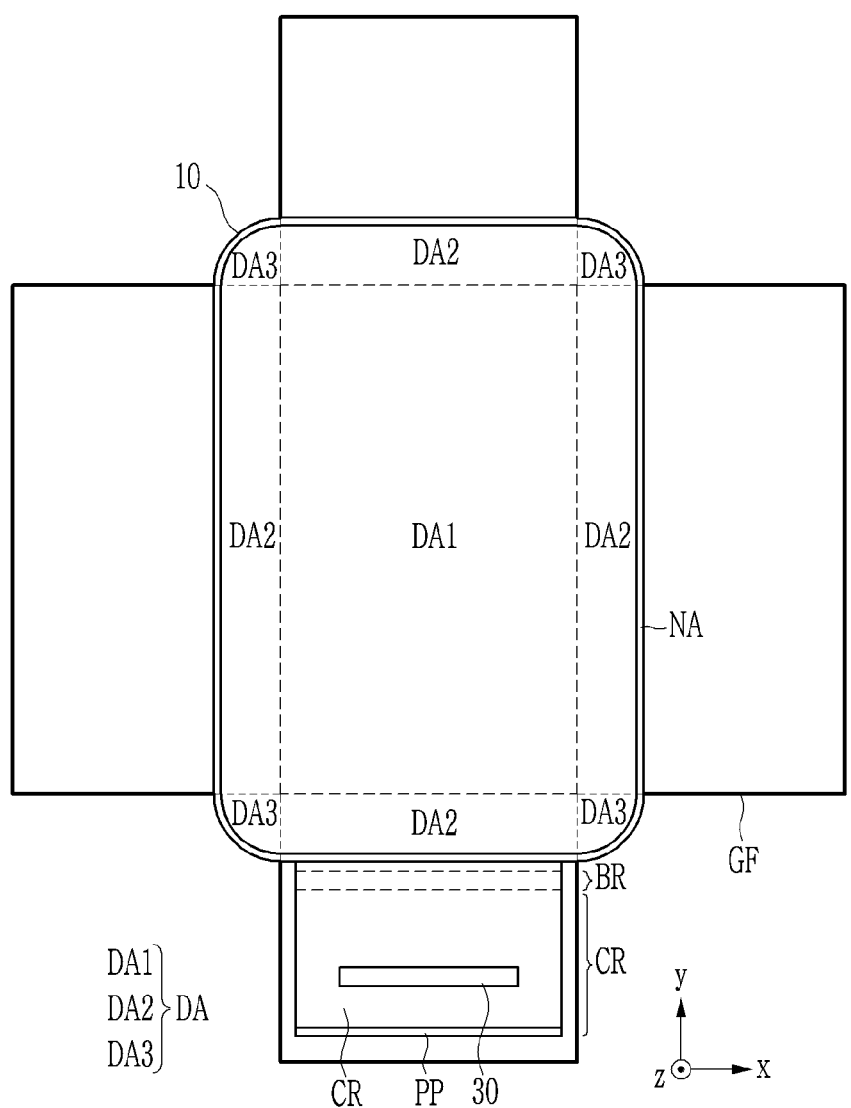
FIG. 6, FIG. 7, FIG. 8, FIG. 9, FIG. 10, FIG. 11, FIG. 12, and FIG. 13 show a manufacturing method of the display device according to an embodiment.

Referring to FIG. 6, a guide film GF may be attached to the rear side of the display panel 10. The guide film GF may be attached to at least a part of the display area DA, but may not be attached to the bending region BR and the connection region CR. The guide film GF may be attached to the first display area DA1 and the second display area DA2 of the display panel 10. The guide film GF may not be attached to the third display area DA3 of the display panel 10. The guide film GF may wholly cover the second display area DA2 and may have a wide size to sufficiently extend to the outside of the second display area DA2.

Figure 7:
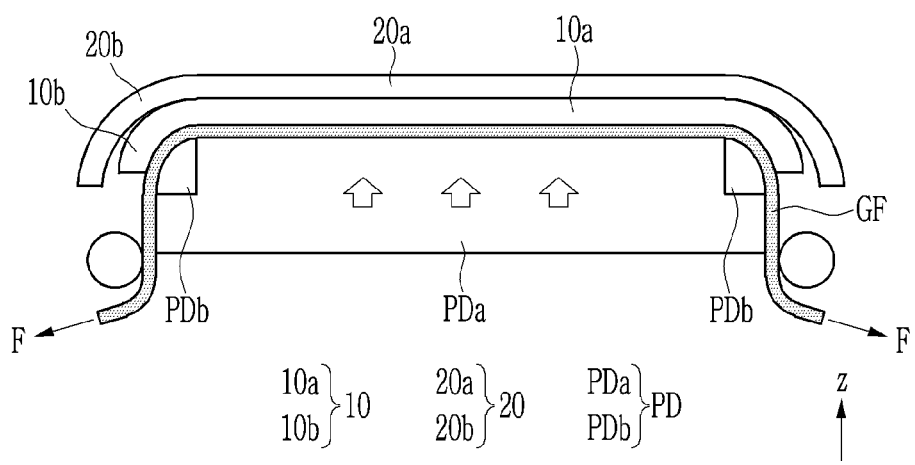

Referring to FIG. 7, a lamination device may include a pressing pad PD including a first pressing pad PDa positioned at a center and a second pressing pad PDb positioned at an edge of the first pressing pad PDa. The first pressing pad PDa may have a flat surface, and the second pressing pad PDb may have a curved surface. A jig (not shown) may be positioned under the pressing pad PD.

The first pressing pad PDa may have a high modulus, and the second pressing pad PDb may have a low modulus. Since the modulus of the second pressing pad PDb is smaller than the modulus of the first pressing pad PDa, the shape of the second pressing pad PDb may be changed more easily. The second pressing pad PDb may be positioned along the top edge of the first pressing pad PDa. The second pressing pad PDb may include or be connected to an air pump, and thus the shape and volume of the second pressing pad PDb may change according to air pressure. The second pressing pad PDb may be a diaphragm. The first pressing pad PDa may be mainly used to attach the first display area DA1, and the second pressing pad PDb may be mainly used to attach the second and third display areas DA2 and DA3.

In a lamination process described with reference to FIG. 7 to FIG. 9, an adhesive layer (not shown) may be formed on a rear side of the window 20. The adhesive layer may be formed by attaching a film-type adhesive such as OCA or applying an adhesive such as OCR to the rear side of the window 20. The adhesive layer may also be formed on the curved area 20b of the window 20. In the lamination process, the window 20 may be fixed to a jig or the like, and lamination may be performed in a vacuum chamber.

Then, the display panel 10 with the guide film GF attached to the rear side may be positioned on the pressing pad PD. When a tensile force F is applied to the guide film GF, the second and third display areas DA2 and DA3 of the display panel 10 may form a curved area 10b. When the second pressing pad PDb includes an air pump or is connected to the air pump, the second pressing pad PDb may have a small or minimum volume with low or minimal air pressure.

Subsequently, the flat area 10a of the display panel 10 may be attached to the flat area 20a of the window 20 by raising the first pressing pad PDa. In this case, the direction of the guide film GF may be adjusted such that the curved area 10b of the display panel 10 does not come into contact with the adhesive layer formed in the curved area 20b of the window 20. The first pressing pad PDa may be raised by raising a jig under the pressing pad PD.

Figure 8:
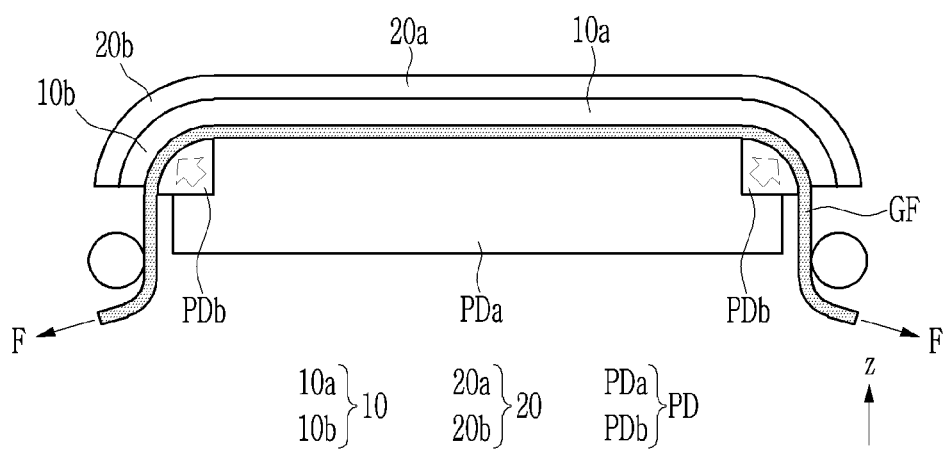

Referring to FIG. 8, it is possible to increase the volume of the second pressing pad PDb while applying the tensile force F to the guide film GF. When the volume of the second pressing pad PDb increases, the curved area 10b of the display panel 10 contacts the adhesive layer formed on the curved area 20b of the window 20 and is in close contact with the curved area 20b, and thus the curved area 10b can be attached to the curved area 20b. When the second pressing pad PDb is a diaphragm, the volume of the second pressing pad PDb may be increased by increasing the air pressure of the second pressing pad PDb. Accordingly, the curved area 10b of the display panel 10 can be closely adhered to and attached to the curved area 20b of the window 20. When the second pressing pad PDb has higher elasticity than the first pressing pad PDa, the intensity or direction of the tensile force of the guide film GF may be adjusted such that the volume of the second pressing pad PDb may be increased.

The tensile force F applied to the guide film GF can be applied until the curved area 10b of the display panel 10 is attached to the curved area 20b of the window 20. To prevent deformation of the flat area 10a of the display panel 10 that has already been attached to the flat area 20a of the window 20, when attaching the curved area 10b of the display panel 10, the first pressing pad PDa must be in close contact with flat area 10a of display panel 10.

Figure 9:
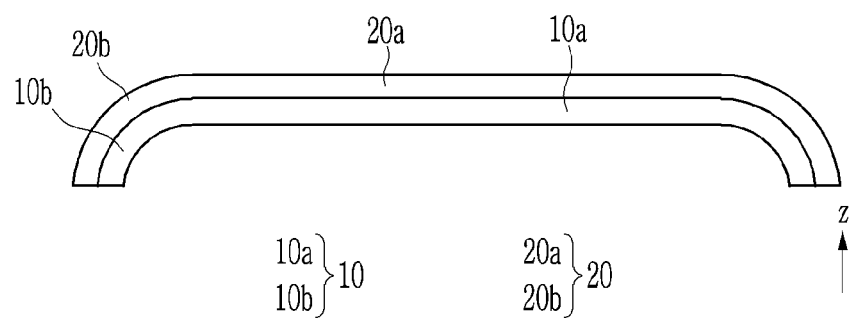

Referring to FIG. 9, after attaching the display panel 10 to the window 20, the guide film GF attached to the rear side of the display panel 10 is removed such that the display device 100, in which the display panel 10 is attached to the window 20 by the adhesive layer, can be manufactured. For easy removal of the guide film GF, the attachment surface of the guide film GF may include an adhesive of which an adhesive strength deteriorates when applied with ultraviolet ("UV") rays or heat. At least a part of the guide film GF may remain in the display device 100.

Although the process of forming the adhesive layer on the rear side of the window 20 and attaching the display panel 10 has been described, the adhesive layer may be formed on the front side of the display panel 10. Although it has been described that the curved area 10b is attached after the flat area 10a is attached, the flat area 10a and the curved area 10b can be attached simultaneously.

Figure 10:
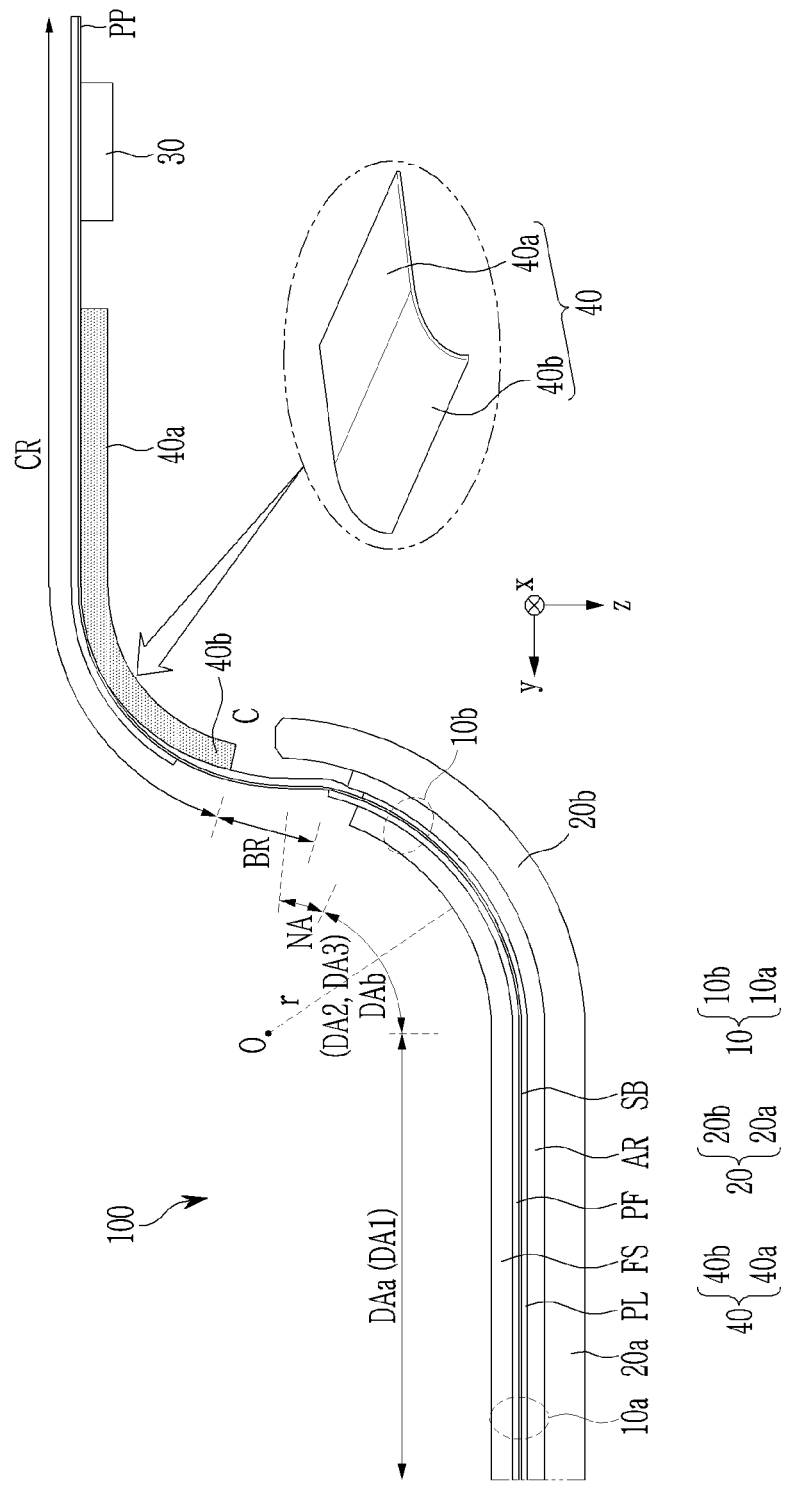

Referring to FIG. 10, after the display panel 10, particularly, the flat area 10a and curved area 10b of the display panel 10 are attached to the window 20, the connection region CR of the display panel 10 may be in an unfolded state. The fixing member 40 is attached to a side where the pad portion PP and the IC chip 30 are positioned among opposite sides of the connection region CR. The fixing member 40 may include a flat portion 40a and a curved portion 40b, and the curved portion 40b may correspond to the curved area 10b of the display panel 10 and the curved area 20b of the window 20, and may have shapes corresponding to the curved areas 10b and 20b. Since the connection region CR is attached to the fixing member 40 having such a shape, it can be deformed into a shape that matches a rear side of the window 20 and a rear side of the display area DA of the display panel 10, and particularly, a part adjacent to the bending region BR may be deformed to a curved surface.

Figure 11:
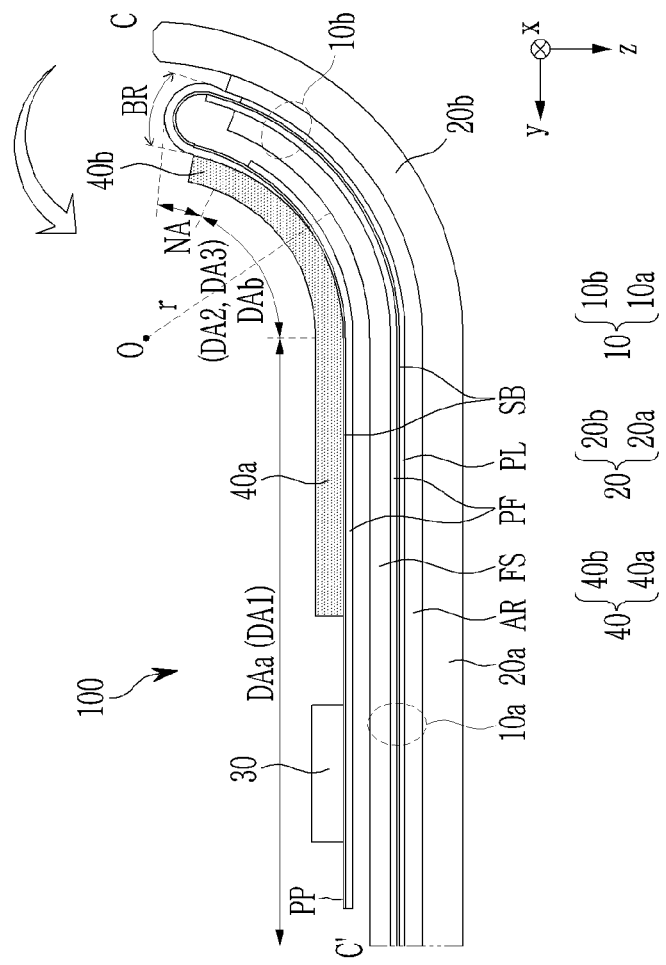
Figure 12:
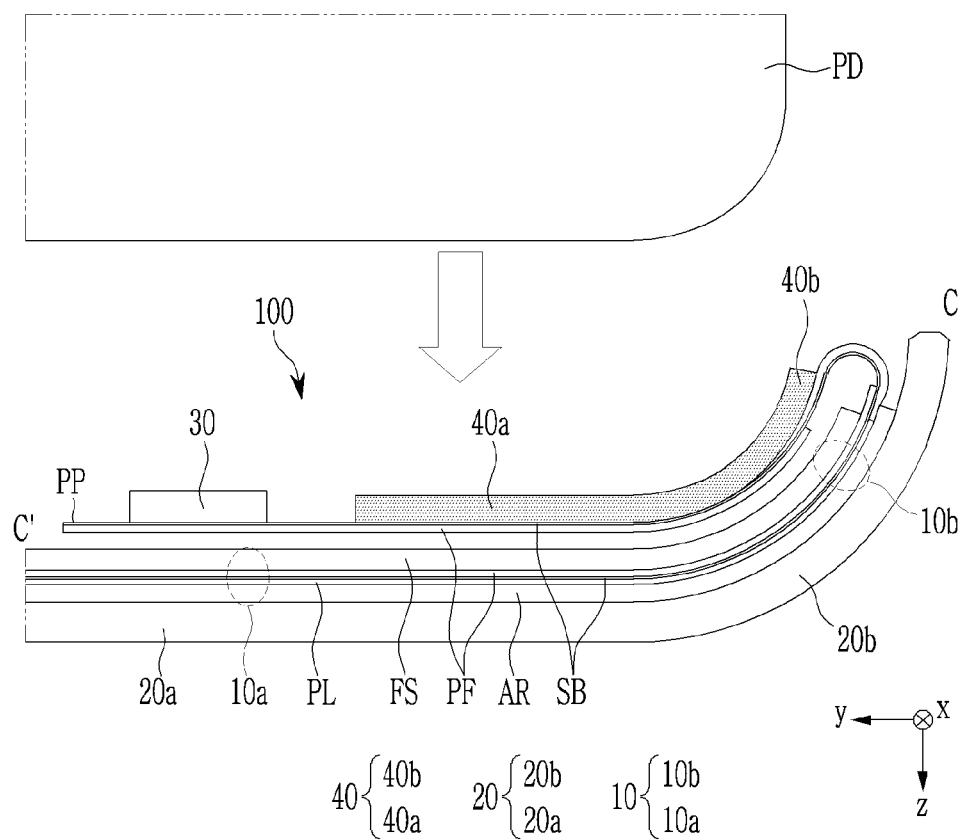

Referring to FIG. 11, the connection region CR to which the fixing member 40 is attached can be folded and positioned adjacent to the rear side of the display panel 10. In this case, the bending region BR may be bent with a predetermined curvature radius. Next, referring to FIG. 12, the pressing pad PD is lowered in the third direction (z), and the fixing member 40 is pressed such that the connection region CR can be attached to the rear side of the display area DA of the display panel 10.

Figure 13:
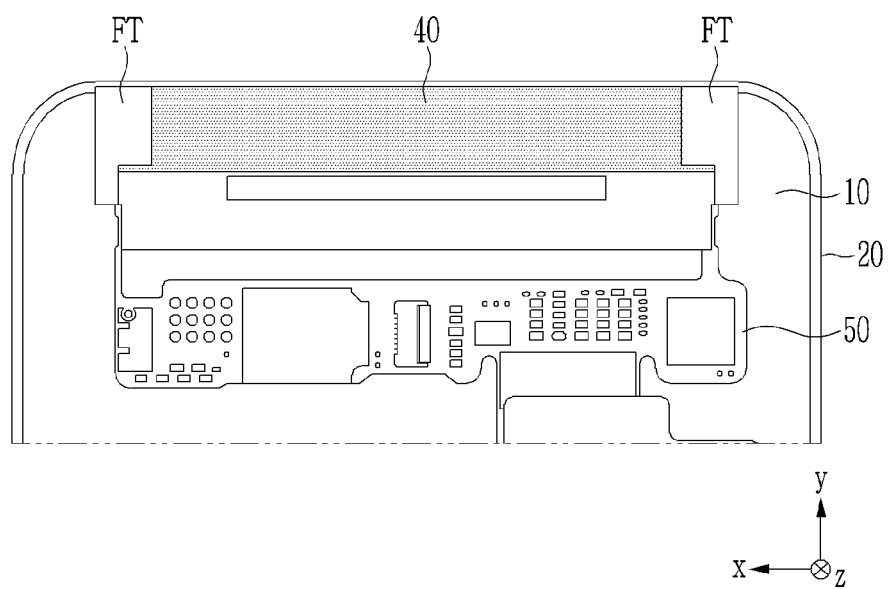

While pressing the fixing member 40, that is, while the connection region CR being in close contact with the fixing member 40, as shown in FIG. 13, a tape FT can be attached to opposite sides of the fixing member 40. The tape FT may be laid out across the fixing member 40 and the display panel 10. An adhesive side of the tape FT can be provided only on one side, and a part of the adhesive side of the tape FT is attached to an edge of the fixing member 40, and a part of the adhesive side of the tape FT is attached to the rear side of the display panel 10 such that the tape FT can fix the fixing member 40 to the rear side of display panel 10. Since the fixing member 40 is fixed to the rear side of the display panel 10 and the connection region CR is pressed by the fixing member 40, the connection region CR can be closely fixed to the rear side of the display panel 10. In addition, since the connection region CR is attached to the fixing member 40, a curved shape corresponding to the curved portion 40b of the fixing member 40 can be maintained.

When the connection region CR is closely fixed to the rear side of the display panel 10 through the above process, the bending region BR is bent uniaxially such that a bending path can be simple. In addition, since the pressing pad PD is pressed in only one direction (i.e., the third direction (z)) and the fixing member 40 rather than the display panel 10 is pressed, the pressing process is simple and damage to the display panel 10 can be prevented. In addition, since the fixing member 40 is fixed using the tape FT instead of using a double-sided adhesive tape to fix the connection region CR, high temperature and high humidity reliability (adhesion power) can be improved.

On the other hand, a flexible printed circuit film 50 (or a printed circuit board) can be bonded to the pad portion PP that can be positioned at the edge of the connection region CR, and the flexible printed circuit film 50 may be positioned on the rear side of the display panel 10 together with the connection region CR. The IC chip 30 may be positioned on the flexible printed circuit film 50.

A configuration of the display panel 10 that may be included in the display device 100 according to an embodiment will be described, focusing on the display area DA, with reference to FIG. 14.

Figure 14:
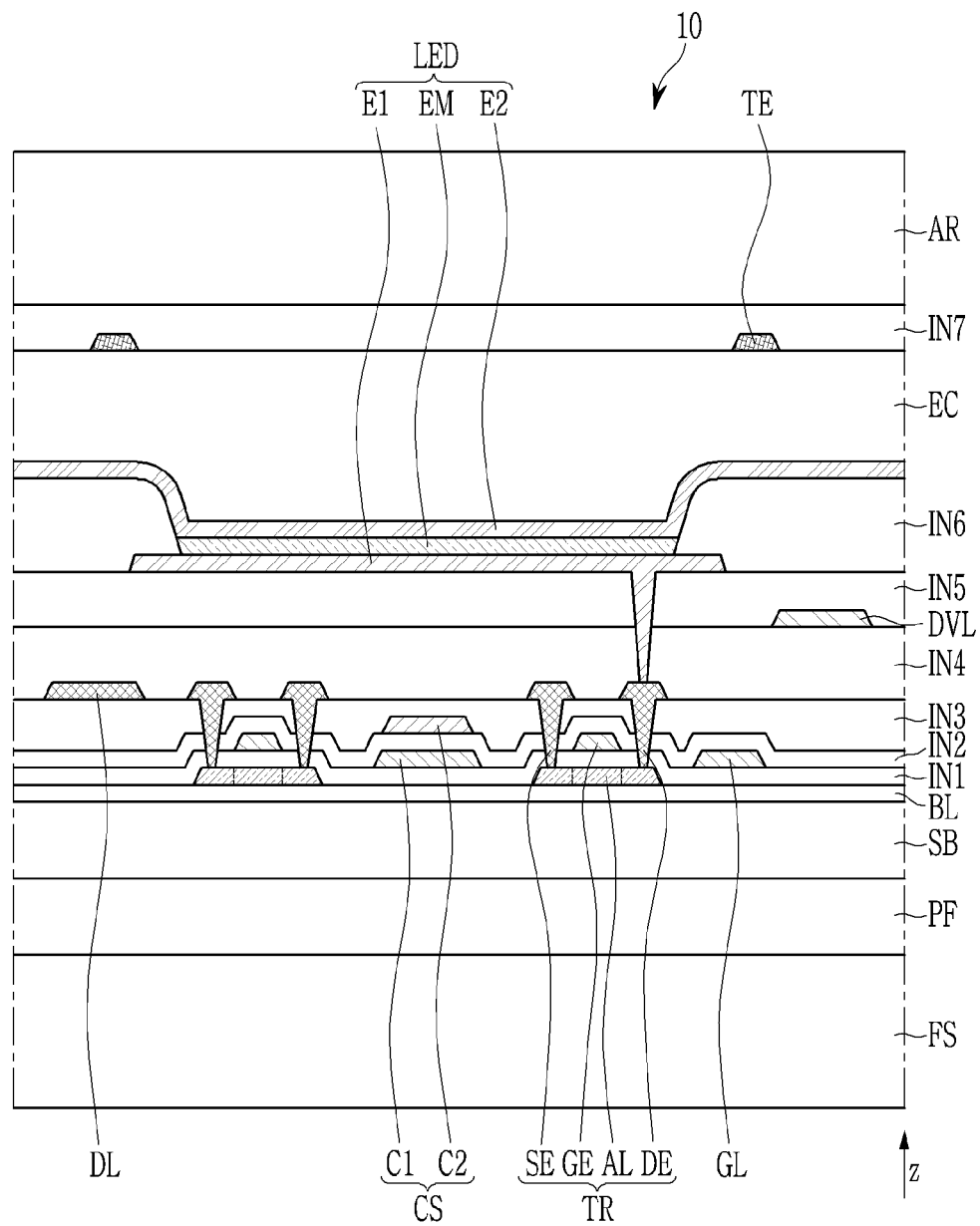
FIG. 14 is a schematic cross-sectional view of a lamination structure of the display panel.

FIG. 14 is a schematic cross-sectional view of a lamination structure of the display panel. The cross-section shown in FIG. 14 may correspond to approximately one pixel area.

The display panel 10 basically include a substrate SB, a transistor TR formed on the substrate SB, and a light emitting diode LED connected to the transistor TR. The light emitting diode LED may correspond to a pixel.

The substrate SB may be a flexible substrate made of a polymer such as polyimide, polyamide, or polyethylene terephthalate. The substrate SB may include a barrier layer that prevents penetration of moisture, oxygen, and the like. For example, the substrate SB may include at least one polymer layer and at least one barrier layer, and the polymer layer and the barrier layer may be alternately stacked.

A buffer layer BL may be positioned on the substrate SB. The buffer layer BL may include an inorganic insulating material such as a silicon oxide or a silicon nitride.

A semiconductor layer AL of the transistor TR may be positioned on the buffer layer BL, and an insulation layer IN1 may be positioned on the semiconductor layer AL. The semiconductor layer AL may include a source region, a drain region, and a channel region between these regions. The semiconductor layer AL may include a semiconductor material such as a polysilicon, an oxide semiconductor, or amorphous silicon.

A first conductor that may include a gate electrode GE of the transistor TR, a gate line GL, a first electrode C1 of the capacitor CS, and the like may be positioned on the insulation layer IN1.

An insulation layer IN2 may be positioned on the first conductor. A second conductor including the second electrode C2 of the capacitor CS may be positioned on the insulation layer IN2. The first conductor and/or the second conductor may include a metal such as molybdenum (Mo), copper (Cu), aluminum (Al), silver (Ag), chromium (Cr), tantalum (Ta), or titanium (Ti).

An insulation layer IN3 may be positioned on the insulation layer IN2 and the second conductor. The insulation layers IN1, IN2, and IN3 may include an inorganic insulating material.

A third conductor that may include a source electrode SE and a drain electrode DE of the transistor TR, a data line DL, and the like may be positioned on the insulation layer IN3. The source electrode SE and the drain electrode DE may be connected to a source region and a drain region of the semiconductor layer AL, respectively, through openings of the insulation layers IN1, IN2, and IN3.

An insulation layer IN4 may be positioned on the third conductor. A fourth conductor that may include a driving voltage line DVL and the like may be positioned on the insulation layer IN4. The third conductor and fourth conductor may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), nickel (Ni), and the like, or a metal alloy.

An insulation layer IN5 may be positioned on the fourth conductor. The insulation layers IN4 and IN5 may include an organic insulating material.

A first electrode E1 of the light emitting diode LED may be positioned on the insulation layer IN5. The first electrode E1 may be referred to as a pixel electrode. The first electrode E1 is connected to the drain electrode DE through the openings of the insulation layers IN4 and IN5 to receive a data signal for controlling luminance of a light emitting diode. The transistor TR to which the first electrode E1 is connected may be a driving transistor or a transistor electrically connected to the driving transistor.

An insulation layer IN6 may be positioned on the insulation layer IN5. The insulation layer IN6 may be referred to as a pixel defining layer and may have an opening overlapping the first electrode E1 in a plan view. In the opening of the insulation layer IN6, a light emitting member EM including an emission layer may be positioned on the first electrode E1, and a second electrode E2 may be positioned on the light emitting member EM. The second electrode E2 may be referred to as a common electrode.

The first electrode E1, the light emitting member EM, and the second electrode E2 may form a light emitting diode LED, which may be an organic light emitting diode. The first electrode E1 and the second electrode E2 may be an anode and a cathode of the light emitting diode LED, respectively.

An encapsulation layer EC may be positioned on the second electrode E2. The encapsulation layer EC may prevent the penetration of moisture or oxygen from the outside by encapsulating the light emitting diode LED. The encapsulation layer EC may be a thin film encapsulation layer including at least one inorganic material layer and at least one organic material layer.

A touch sensor layer including a touch electrode TE may be positioned on the encapsulation layer EC. The touch electrode TE may have a mesh shape having an opening overlapping the light emitting diode LED in a plan view. A buffer layer may be positioned between the encapsulation layer EC and the touch sensor layer. An insulation layer IN7 covering the touch electrode TE may be positioned on the touch sensor layer.

An anti-reflection layer AR to reduce external light reflection may be positioned on the insulation layer IN7. The anti-reflection layer AR may include a polarization layer. The anti-reflection layer AR may be attached by an adhesive or may be formed on the insulation layer IN7. Instead of the anti-reflection layer AR, the anti-reflection effect may be obtained by forming the encapsulation layer EC, the touch sensor layer, and/or the insulation layer IN7 in a refractive index matching structure. Layers positioned between the substrate SB and the anti-reflection layer AR may correspond to the aforementioned pixel layer PL.

A protective film PF to protect the display panel 10 can be positioned under the substrate SB. The protective film PF may be formed of a polymer such as polyethylene terephthalate, polyethylene naphthalate, or polyimide. In order to reduce bending stress in the bending region, the protective film PF may not be positioned in the bending region BR. In the bending region BR, a bending protective layer (stress relief layer) may be positioned such that wires positioned in the bending region BR are not disconnected or damaged.

A functional sheet FS including at least one of a cushion layer, a heat dissipation sheet, a light blocking sheet, a waterproof tape, and an electron blocking film may be positioned under the protective film PF. The functional sheet FS may not be positioned in the bending region BR and the connection region CR.

The position and alignment of the above elements can be variously changed according to the design.

While this disclosure has been described in connection with what is presently considered to be practical embodiments, it is to be understood that the present invention is not limited to the disclosed embodiments. On the contrary, it is intended to cover various modifications and equivalent arrangements included within the spirit and scope of the appended claims.

DESCRIPTION OF SYMBOLS

| | |
|---|---|
| 100: display device | 10: display panel |
| 10a: flat area | 10b: curved area |
| 20: window | 20a: flat area |
| 20b: curved area | 30: IC chip |
| 40: fixing member | 40a: flat portion |
| 40b: curved portion | 50: flexible printed circuit film |
| BR: bending region | CR: connection region |
| DA: display area | DA1: first display area |
| DA2: second display area | DA3: third display area |
| DAa: flat display area | DAb: curved display area |
| FT: tape | NA: non-display area |
| PD: pressing pad | PP: pad portion |

The invention claimed is:

1. A display device comprising:
a window including a flat area and a curved area;
a display panel including a display area, a connection region, and a bending region between the display area and the connection region; and
a fixing member including a flat portion and a curved portion and fixed to the connection region,
wherein the display area is attached to the window,
wherein the connection region is disposed on a rear side of the display area together with the fixing member,
wherein the display panel includes a substrate that is continuously positioned in the display area, the bending region, and the connection region, and
wherein the window, the display area, the connection region, and the fixing member are stacked in an order of the window, the display area, the connection region, and the fixing member.

2. The display device of claim 1, further comprising a tape, which attaches the fixing member to the rear side of the display area.

3. The display device of claim 1, wherein
a curvature center of the curved area of the window and a curvature center of the curved portion of the fixing member are substantially equivalent.

4. The display device of claim 3, wherein
the display area includes a flat area and a curved area, and
a curvature center of the curved area of the display area and the curvature center of the curved portion of the fixing member are substantially equivalent.

5. The display device of claim 1, wherein
the connection region is disposed between the display area and the fixing member.

6. The display device of claim 1, further comprising an integrated circuit (IC) chip mounted on the connection region.

7. The display device of claim 6, wherein
the fixing member is disposed between the bending region and the IC chip.

8. The display device of claim 6, wherein
the connection region comprises a pad portion where pads are arranged around an edge of the connection region.

9. The display device of claim 1, wherein
a width of the fixing member is equal to or larger than a width of the connection region.

10. The display device of claim 1, wherein
the bending region is bent, the connection region has a flat shape corresponding to the flat portion and a curved shape corresponding to the curved portion, and the connection region is in contact with a rear side of the display area.

11. The display device of claim 1, wherein
the display area includes a flat area and a curved area, and
the curved area of the window has a larger curvature radius than the curved area of the display area, and the curved area of the display area has a larger curvature radius than the curved portion.

12. An electronic device comprising:
a window;
a display panel including a display area attached to a rear side of the window and a connection region fixed to a rear side of the display area;
a fixing member attached to the connection region; and
a tape attaching the fixing member to a rear side of the display panel,
wherein the display panel includes a substrate that is continuously positioned in the display area and the connection region, and
wherein the window, the display area, the connection region, and the fixing member are stacked in an order of the window, the display area, the connection region, and the fixing member.

13. The electronic device of claim 12, wherein
the window comprises a curved area, the fixing member comprises a curved portion corresponding to the curved area of the window, and a curvature center of the curved area of the window and a curvature center of the curved portion are substantially equivalent.

14. The electronic device of claim 13, wherein
the connection region is disposed between the display area and the fixing member, and the connection region has a curved shape corresponding to the curved portion of the fixing member.

15. The electronic device of claim 13, wherein
the display area comprises a curved area attached to the curved area of the window, and
the curved area of the window has a larger curvature radius than the curved area of the display area, while the curved area of the display area has a larger curvature radius than the curved portion.

16. The electronic device of claim 12, further comprising an integrated circuit (IC) chip mounted on the connection region,
wherein the connection region includes a pad portion where pads are arranged around an edge of the connection region.

* * * * *